(12) United States Patent
Jamison (10) Patent No.: US 9,312,577 B2
(45) Date of Patent: Apr. 12, 2016

(54) CIRCUITS AND METHODS FOR DETERMINATION AND CONTROL OF SIGNAL TRANSITION RATES IN ELECTROCHEMICAL CELLS

(71) Applicant: BATTELLE ENERGY ALLIANCE, LLC, Idaho Falls, ID (US)

(72) Inventor: David Kay Jamison, Idaho Falls, ID (US)

(73) Assignee: BATTELLE ENERGY ALLIANCE, LLC, Idaho Falls, ID (US)

( * ) Notice: Subject to any disclaimer, the term of this patent is extended or adjusted under 35 U.S.C. 154(b) by 497 days.

(21) Appl. No.: 13/673,065

(22) Filed: Nov. 9, 2012

(65) Prior Publication Data

US 2014/0132220 A1    May 15, 2014

(51) Int. Cl.
*H02J 7/00* (2006.01)
*H01M 10/44* (2006.01)
*G01R 31/36* (2006.01)

(52) U.S. Cl.
CPC ......... *H01M 10/441* (2013.01); *G01R 31/3606* (2013.01); *H02J 7/0029* (2013.01)

(58) Field of Classification Search
CPC ....... H02J 7/0093; H02J 7/045; H01M 10/44; Y02E 60/12; Y02E 60/122
USPC ........................................................ 320/129
See application file for complete search history.

(56) References Cited

U.S. PATENT DOCUMENTS

| 5,307,000 A * | 4/1994 | Podrazhansky et al. ...... 320/129 |
| 5,937,622 A | 8/1999 | Carrier et al. |
| 6,870,378 B1 * | 3/2005 | Cole et al. ................. 324/750.07 |
| 7,274,100 B2 | 9/2007 | Pavier et al. |
| 7,592,778 B2 | 9/2009 | Ooshita et al. |
| 7,795,874 B1 * | 9/2010 | Kirchev ......................... 324/427 |
| 2003/0042871 A1 | 3/2003 | Schlicht |
| 2005/0007067 A1 * | 1/2005 | Baarman et al. ............... 320/108 |
| 2006/0098390 A1 | 5/2006 | Ashtiani et al. |
| 2010/0123436 A1 | 5/2010 | Herrod et al. |
| 2011/0077880 A1 | 3/2011 | Gering |
| 2011/0234172 A1 * | 9/2011 | Kung ............................. 320/137 |

OTHER PUBLICATIONS

"IntelliMAX Advanced Load Switches," Fairchild Semiconductor, <<www.fairchildsemi.com>> 2007, 6 pages.

(Continued)

*Primary Examiner* — Arun Williams
(74) *Attorney, Agent, or Firm* — TraskBritt (57) ABSTRACT

A charge/discharge input is for respectively supplying charge to, or drawing charge from, an electrochemical cell. A transition modifying circuit is coupled between the charge/discharge input and a terminal of the electrochemical cell and includes at least one of an inductive constituent, a capacitive constituent and a resistive constituent selected to generate an adjusted transition rate on the terminal sufficient to reduce degradation of a charge capacity characteristic of the electrochemical cell. A method determines characteristics of the transition modifying circuit. A degradation characteristic of the electrochemical cell is analyzed relative to a transition rate of the charge/discharge input applied to the electrochemical cell. An adjusted transition rate is determined for a signal to be applied to the electrochemical cell that will reduce the degradation characteristic. At least one of an inductance, a capacitance, and a resistance is selected for the transition modifying circuit to achieve the adjusted transition rate.

22 Claims, 7 Drawing Sheets

(56) References Cited

OTHER PUBLICATIONS

"Intersil, ISL62873, Data Sheet, FN6930.1," Intersil Americas Inc., Aug. 31, 2010, pp. 1-17.

"Micrel, MIC94080/1/2/3/4/5," Micrel Inc. Jan. 2011, pp. 1-16.

"Texas Instruments, Three- or Four-Cell Lithium-Ion Protector Circuit," Texas Instruments Incorporated, <<www.ti.com>> 2002, 15 pages.

Zhao et al., "DC-DC Power Conversions and System Design Considerations for Battery Operated System," 2011, pp. 6-1 to 6-18.

* cited by examiner

CIRCUITS AND METHODS FOR DETERMINATION AND CONTROL OF SIGNAL TRANSITION RATES IN ELECTROCHEMICAL CELLS

CONTRACTUAL ORIGIN

This invention was made with government support under Contract Number DE-AC07-05ID14517 awarded by the United States Department of Energy. The government has certain rights in the invention.

FIELD

The present disclosure relates generally to the field of batteries and, more particularly, to control of charge and discharge of rechargeable batteries.

BACKGROUND

A battery converts stored chemical energy to electrical energy, which may be conveyed as a voltage source. As a battery ages its storage capacity will decrease (i.e., fade) between a Beginning Of Life (BOL) and an End Of Life (EOL). Therefore, observations of battery parameters such as cycle rate, cumulative cycling time, and storage capacity may be helpful in determining an overall State Of Health (SOH) of a battery over its service life.

To compensate for a battery's low energy transfer rate, some EV systems use Ultracapacitors to provide high energy rates for short durations. For example, in electric vehicles, high energy transfers occur during quick accelerations or regenerative braking. Hybrid ultracapacitor battery systems reduce the overall size of the battery ultracapacitor pair. In such systems, the ultracapacitor bank is configured in a general load sharing arrangement with the battery. Such systems are known to enhance longevity of the battery by removing high energy pulses from the battery and directing them to the ultrcapacitor. In contrast, embodiments discussed herein are not based on a load sharing concept.

High energy charge and discharge pulses on a battery degrade storage capacity and energy delivery characteristics of the battery. In addition, degradation is particularly pronounced when the charge and discharge pulses have very fast rise and fall times.

There is a need for methods and circuits for use with batteries to at least one of determine, detect, and adjust for rapid transitions of charge pulses and discharge pulses from systems coupled to the battery and to adjust the transition rate of such pulses before they reach the battery to reduce degradation that occurs if the transition rate is not adjusted.

SUMMARY

Embodiments of the present disclosure are configured to determine, detect, adjust, or combinations of the foregoing, transition rates of charge pulses and discharge pulses from systems coupled to electrochemical cells and adjust the transition rates of such pulses before they reach the battery to reduce degradation that occurs if the transition rate is not adjusted.

In an embodiment of the present disclosure, a circuit includes one or more electrochemical cells, a charge/discharge input, and a transition modifying circuit. The charge/discharge input is for respectively supplying charge pulses and discharge pulses to the one or more electrochemical cells, wherein the charge pulses and discharge pulses include a transition rate. The transition modifying circuit is operably coupled between the charge/discharge input and a terminal of the one or more electrochemical cells and includes at least one circuit element configured to generate an adjusted transition rate on the terminal that is slower than the transition rate and sufficient to reduce degradation of one or more charge capacity characteristics of the one or more electrochemical cells.

Embodiments of the present disclosure include a method that includes supplying a charge/discharge input for one or more electrochemical cells, the charge/discharge input including charge pulses and discharge pulses with an input transition rate. The method also includes modifying the input transition rate to an applied transition rate by including a circuit between the charge/discharge input and a terminal of the one or more electrochemical cells. The circuit includes at least one circuit element structured to generate the applied transition rate on the terminal at a rate sufficient to reduce degradation of one or more charge capacity characteristics of the one or more electrochemical cells relative to degradation at the input transition rate.

Other embodiments of the present disclosure include a method of determining characteristics of a transition modifying circuit. The method includes analyzing one or more degradation characteristics of an electrochemical cell relative to a transition rate of a charge/discharge input applied to the electrochemical cell. An adjusted transition rate is determined for a signal to be applied to the electrochemical cell responsive to the analyzing that will reduce the one or more degradation characteristics. The method also includes selecting at least one of an inductance, a capacitance, and a resistance of the transition modifying circuit for coupling between the electrochemical cell and the charge/discharge input to achieve the adjusted transition rate.

Still other embodiments of the present disclosure include a method of determining characteristics of a transition modifying circuit. The method includes repeatedly applying a charge pulse and a discharge pulse over an analysis period to each of: a first transition modifying circuit configured to receive the charge pulse and the discharge pulse and generate a first transition rate on a first signal applied to a first electrochemical cell, and a second transition modifying circuit configured to receive the charge pulse and the discharge pulse and generate a second transition rate on a second signal applied to a second electrochemical cell; wherein the second transition rate is different from the first transition rate. Capacity loss is determined for each of the first electrochemical cell and the second electrochemical cell after the analysis period. The method also includes repeating the repeatedly applying and determining the capacity loss to determine a loss trend for each of the first electrochemical cell and the second electrochemical cell. Components for the transition modifying circuit are selected responsive to the loss trend of the first electrochemical cell and the loss trend of the second electrochemical cell.

DETAILED DESCRIPTION

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description, reference is made to the accompanying drawings which form a part hereof, and in which is shown, by way of illustration, specific embodiments. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and may be implemented on any number of data signals including a single data signal.

Those of skill would further appreciate that the various illustrative logical blocks, modules, circuits, and algorithms as described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments described herein.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

Figure 3:
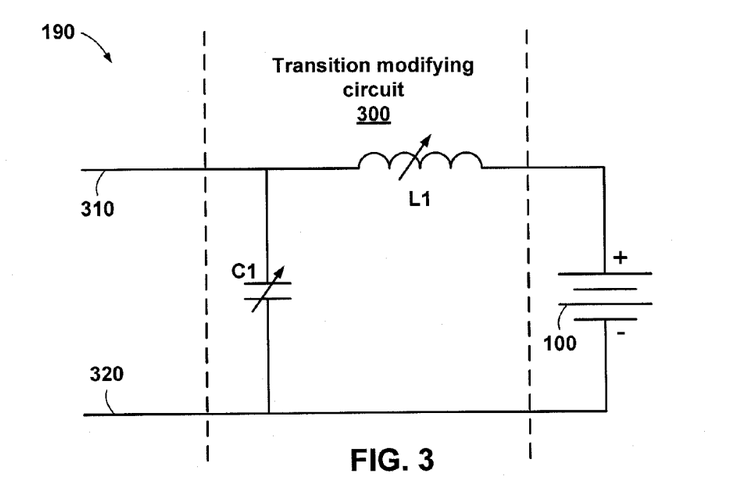
FIG. 3 is a circuit diagram of an embodiment of a transition modifying circuit.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. For example, where feasible, elements in FIG. 3 are designated with a format of 3xx, where 3 indicates FIG. 3 and xx designates the unique element.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

Embodiments of the present invention detect, adjust, or combinations thereof transition rates of charge pulses and discharge pulses from systems coupled to electrochemical cells and adjust the transition rates of such pulses before they reach the battery to reduce degradation that may occur if the transition rate was not adjusted.

Much of the description herein concentrates on lithium-ion cells. However, embodiments of the present invention are not so limited and may be applicable to other types of electrochemical cells. In addition, for ease of description, one or more electrochemical cells may also be referred to herein as a battery.

Figure 1:
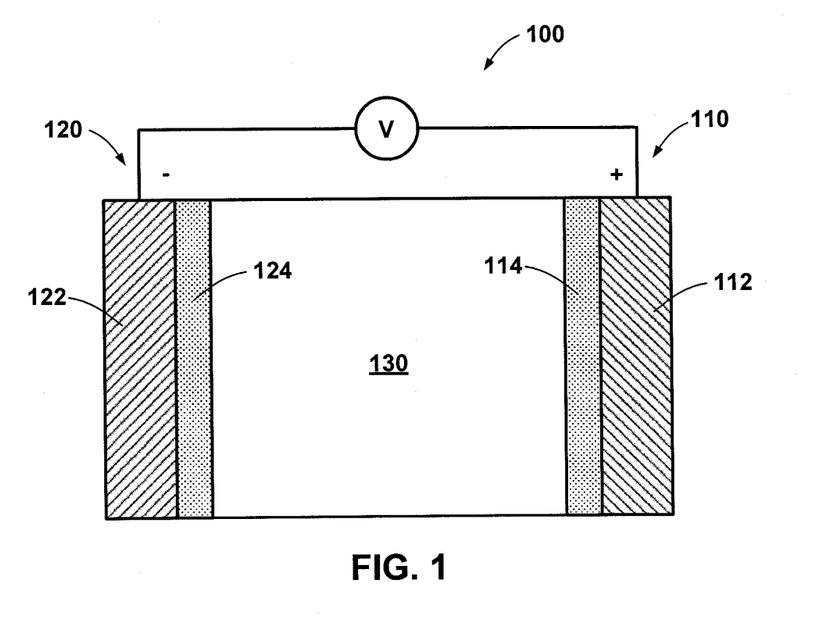
FIG. 1 is a simplified diagram of a rechargeable electrochemical cell.

FIG. 1 is a simplified diagram of a rechargeable lithium-ion electrochemical cell 100. A typical lithium-ion cell includes three primary functional components, a positive terminal 110, a negative terminal 120, and electrolyte 130. The electrochemical cell 100 may also include a separator (e.g., a polymeric microporous material, not shown) provided between the negative terminal 120 and the positive terminal 110. A battery may include one or more electrochemical cells 100 to form a current and voltage capability based on the application for which it is used.

The positive terminal 110 includes a positive current collector 112 and a positive active material 114. The negative terminal 120 includes a negative current collector 122 and a negative active material 124. Both the positive active material 114 and the negative active material 124 are materials into which and from which lithium ions can migrate. The movement of lithium ions into the active materials (114, 124) is often referred to as intercalation or insertion and the movement of lithium ions out of the active materials (114, 124) is referred to as deintercalation or extraction.

The negative active material 124 may be a carbonaceous material such as graphite. The positive active material 114 may be a material, such as, for example, lithium cobalt oxide, lithium iron phosphate, or lithium manganese oxide. The positive current collector 112 and negative current collector 122 may be a material such as aluminum, copper, or other suitable electrically conductive material. The electrolyte 130 is typically an organic electrolyte that acts as an ionic path between electrodes 110 and 120.

The electrodes (110, 120) may be provided as relatively flat or planar plates or may be wrapped or wound in a spiral or other configuration (e.g., an oval configuration). The electrodes (110, 120) may also be provided in a folded configuration.

During charging and discharging of the electrochemical cell 100, lithium ions move through the electrolyte 130 between the positive electrode 110 and the negative electrode 120. For example, when the electrochemical cell 100 is discharging, lithium ions flow from the negative electrode 120 to the positive electrode 110. Conversely, when the electrochemical cell 100 is charging, lithium ions flow from the positive electrode 110 to the negative electrode 120.

A passivating layer, also referred to herein as solid electrolyte interphase (SEI), may develop between an electrode (110, 120) and the electrolyte 130 from the reductive decompositions of a small amount of organic electrolytes mostly during the first several cycles of a working cell.

Degradation of capacity may occur from a variety of mechanisms within the battery 100. As a non-limiting example, cells may include regions of various voltage gradients in pockets and pores of the positive terminal 110 and negative terminal 120. If the voltage gradients move through the battery 100 too quickly, they can cause unwanted chemical reactions to occur. By reducing voltage gradients and allowing ions more time to adjust to the voltage gradients as they move through the battery 100, unwanted chemical combinations, reactions, or breaking of bonds may be reduced. This may be especially true for initial voltage gradients applied from a resting state when the ions may be within pockets and moving them out rapidly can cause degradation to occur.

Figure 2A:
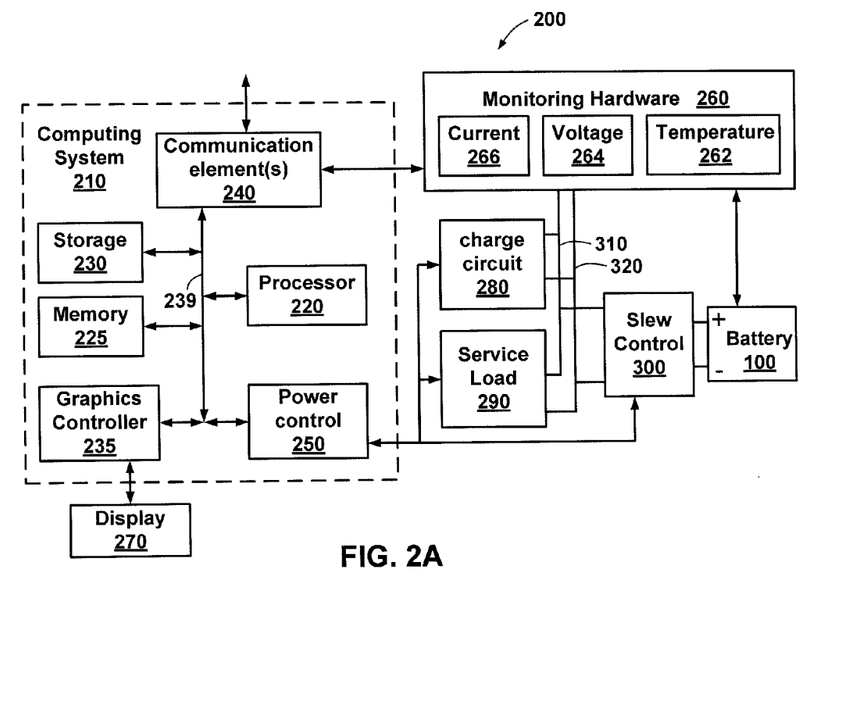
FIG. 2A is a simplified diagram of a system for analyzing, controlling, or a combination thereof, an electrochemical cell.

FIG. 2A is a simplified diagram of a system 200 for analyzing, monitoring, and controlling a battery 100. A computing system 210 is configured for executing software programs containing computing instructions and includes one or more processors 220, memory 225, one or more communication elements 240, and storage 230.

The one or more processors 220 may be configured for executing a wide variety of operating systems and applications including the computing instructions for carrying out embodiments described herein.

The memory 225 may be used to hold computing instructions, data, and other information for performing a wide variety of tasks including performing embodiments described herein. By way of example, and not limitation, the memory may include Synchronous Random Access Memory (SRAM), Dynamic RAM (DRAM), Read-Only Memory (ROM), Flash memory, and the like.

The communication elements 240 may be configured for communicating with other devices or communication networks (not shown). As non-limiting examples, the communication elements 240 may interface with external hardware and software (e.g., for cell or battery charging through an external device or grid) or for downloading stored data to an external data logger, or computer. By way of example, and not limitation, the communication elements 240 may include elements for communicating on wired and wireless communication media, such as for example, serial ports, parallel ports, Ethernet connections, universal serial bus (USB) connections IEEE 1394 ("firewire") connections, BLUETOOTH® wireless connections, 802.1 a/b/g/n type wireless connections, and other suitable communication interfaces and protocols.

The storage 230 may be used for storing large amounts of non-volatile information for use in the computing system 210 and may be configured as one or more storage devices. By way of example, and not limitation, these storage devices may but are not limited to magnetic and optical storage devices such as disk drives, Flash memory, magnetic tapes, CDs (compact discs), DVDs (digital versatile discs or digital video discs), and other equivalent storage devices.

When executed as firmware or software, the instructions for performing the processes described herein may be stored on a computer-readable medium. A computer-readable medium includes, but is not limited to, magnetic and optical storage devices such as disk drives, magnetic tape, CDs (compact discs), DVDs (digital versatile discs or digital video discs), and semiconductor devices such as RAM, DRAM, ROM, EPROM, and Flash memory.

By way of non-limiting example, computing instructions for performing the processes may be held on the storage 230, transferred to the memory 225 for execution, and executed by the processor 220. The processor 220, when executing computing instructions configured for performing the processes, constitutes structure for performing the processes and may be considered a special purpose computer when executing the computing instructions. In addition, some or all portions of the processes may be performed by hardware specifically configured for carrying out the processes.

The storage 230 and memory 225 are coupled to the processor 220 such that the processor 220 can read information from, and write information thereto. In the alternative, the storage medium may be integral to the processor. Furthermore, the processor 220, memory 225 and storage 230 may reside, in various combinations, in an ASIC or FPGA.

A graphics controller 235 may be coupled to the processor 220 and to a display 270, which may present information about the battery 100 and the processes described herein in the form of pictures, text, tables, graphs, and the like.

The elements of the computing system 210 are illustrated, for simplicity, as communicating across a bus 239. However, those of ordinary skill in the art will recognize that the computing system 210 may include many different buses for communication between the various elements.

Monitoring hardware 260 may be included in the system 200 for monitoring various cell characteristics, functions, and status of the battery 100. These various measurements may be provided to the computing system 210 as measured characteristics. A voltage monitor 264 and a current monitor 266 may be coupled to the battery 100 to monitor operational power characteristics of the entire battery 100, power characteristics of individual cells in the battery 100, and combinations thereof. A temperature monitor 262 may be included to monitor overall temperature of the battery 100, temperature of individual cells in the battery 100, and combinations thereof. A timing monitor (not shown) may be included as monitoring hardware 260 or may be performed by the computing system 210. The timing monitor may track cycling of the battery 100 including times associated with charging and discharging the battery 100. The monitoring hardware 260 may be controlled and queried by the computing system 210 through general purpose or dedicated communication channels from the communication elements 240. Moreover, the monitoring hardware 260 may be configured for monitoring the parameters discussed above at the battery 100 or at inputs to a transition modifying circuit 300 (may also be referred to herein as a slew control circuit).

A charge circuit 280 may be included to control charging and possibly discharging of the battery 100. The charge circuit 280 may provide information related to timing and electrical power characteristics of the battery 100 to the monitoring hardware 260. The charge circuit 280 may be controlled by a dedicated power control module 250 on the computing system 210. Alternatively, the computing system 210 may control the charge circuit 280 through general purpose or dedicated communication channels from the communication elements 240.

A service load 290 generally represents other elements (not shown) within the system 200 that may draw power from the battery 100.

Functionally, the processes described herein may be considered to be controlled by a diagnostic center software process. The software process may include test protocols defined for interrogation of the battery 100, the transition modifying circuit 300, or combinations thereof using elements for data acquisition of characteristics such as current, voltage, and temperature over time and charge cycling. Diagnostic analysis algorithms may be defined as discussed below. Data regression algorithms may be implemented to define and refine various models and model parameters. Software modules may be included to store data in various raw and processed forms as may be needed by other processes and a data logger may be included to collect and store a performance history of the battery 100.

The computing system 210, or portions thereof, may also be referred to herein as an analysis module. Moreover, the computing system 210 may be configured as part of a system to analyze different types of transition modifying circuits 300 to determine which circuits may best reduce cell degradation as well as an operational system that can monitor, modify, and adjust characteristics of the transition modifying circuit 300.

As a non-limiting example, the system 200 may be part of an electric vehicle wherein the charge circuit 280 includes elements for generating power to be applied to the battery 100, such as, for example, from regenerative braking. Similarly, the service load 290 may include elements such as motors coupled to the drive train and other electrical loads receiving power from the battery 100. The computing system 210 also may be used for other battery management functions such as determining pulse size and duration for the charge circuit 280 and the service load 290.

In some systems where active feedback may be desired, the system 200 may be configured to adjust characteristics of the transition modifying circuit 300. In such cases, the system 200 may be configured to periodically sample cell characteristics of an electrochemical cell (.e.g., a battery 100) and determine electrochemical cell information from the sampled characteristics. From the electrochemical cell information, degradation characteristics of the battery 100 may be determined and incorporated into one or more cell degradation models, which may be used to adapt operation of the transition modifying circuit 300. As non-limiting examples, some of the degradation characteristics may include loss of active host sites, loss of free lithium sites, reversible losses, and irreversible losses. In some systems, this feedback may occur over relatively long periods (e.g., days or months) during the life of the battery 100 and the changes to the transition modifying circuit 300 may be accomplished by replacing the circuit or components of the circuit.

In other cases, the system 200 may be considered as a system used to determine characteristics of the battery 100 and analyze many different resistive constituents, capacitive constituents, inductive constituents, and combinations thereof for the transition modifying circuit 300 as described below in connection with FIGS. 5 through 8. Such an analysis can determine an appropriate transition modifying circuit 300 that will provide the desired effect of modified transition rates for charge pulses and discharge pulses before they reach the battery to reduce degradation that occurs if the transition rate is not adjusted.

In still other cases where the battery 100 and transition modifying circuit 300 are in use, the system 200 may be very simple and include just the battery 100, the transition modifying circuit 300, and a circuit or system that generates charge pulses and discharge pulses.

Figure 2B:
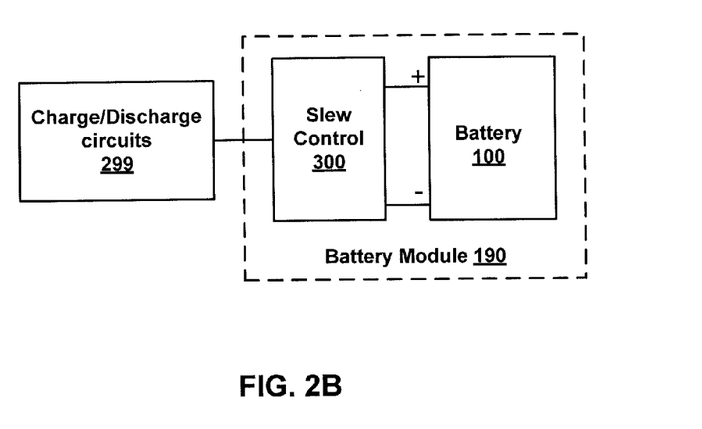
FIG. 2B is a simplified diagram of a transition modifying circuit coupled with an electrochemical cell as a battery module that may be coupled to a charge/discharge circuit.

FIG. 2B is a simplified diagram of such a system with a transition modifying circuit 300 coupled with a battery 100. In some embodiments, the transition modifying circuit 300 may be coupled and deployed with the battery 100 such that one can consider the combination a battery module 190, which is coupled to a charge/discharge circuit 299. For many batteries 100, the transition modifying circuit 300 will not need to change during the life of the battery 100 and elements of the circuit are determined ahead of time through experimentation as described below. Thus, the transition modifying circuit 300 may be considered as an intermediary device coupled to the battery 100 and modifying transition rates to the battery 100 regardless of what any control system generates in the form of charging and discharging waveforms.

In other words, the transition modifying circuit 300 may be viewed as a type of protection layer between charging sources and discharging sinks and the battery 100 to protect the battery 100 from transition rates that degrade the charge capacity characteristics of the battery 100.

FIG. 3 is a circuit diagram of an embodiment of a transition modifying circuit 300 coupled to a battery 100. An inductor L1 is coupled between a charge/discharge input 310 (FIG. 2A) and a positive terminal of the battery 100. A capacitor C1 is coupled between the charge/discharge input 310 and a negative terminal 320 (FIG. 2A) of the battery 100. In some embodiments, the negative terminal 320 may be considered a ground terminal 320. In combination, the capacitor C1 provides a capacitive constituent and the inductor L1 provides an inductive constituent for the transition modifying circuit 300, which can be considered to provide a low-pass filtering function. In other embodiments, resistors (not shown) may be included to provide a resistive constituent. Thus, capacitors C1, inductors L1, and resistors may be combined to create a low-pass network that provides for modification of transition rates between the charge/discharge input 310 and the signal applied to the positive terminal of the battery 100. Some examples of such low-pass networks are pi-filters, capacitance filters (e.g., a capacitor or a resistor-capacitor combination), and other similar networks.

For example, where losses and some heat generation are not as large of a concern (e.g., uninterruptable power supplies), the transition modifying circuit 300 may include only a resistance component. Examples of resistive elements include, but are not limited to, simple resistors, Insulated Gate Bipolar Transistors (IGBTs), Field Effect Transistors (FETs) or switched resistive elements.

In some embodiments, the capacitor C1 may be a variable capacitor such that the capacitive constituent can be modified in-situ either when the transition modifying circuit 300 is placed in a system, or adaptively as conditions of the system change. Similarly, the inductor L1 may be a variable inductor such that the inductive constituent can be modified. For large power applications, such as automotive applications, variable capacitors may not be feasible. However, the capacitor C1 may be a bank of capacitors that may be switched in or out to create the desired amount of capacitance.

Figure 4:
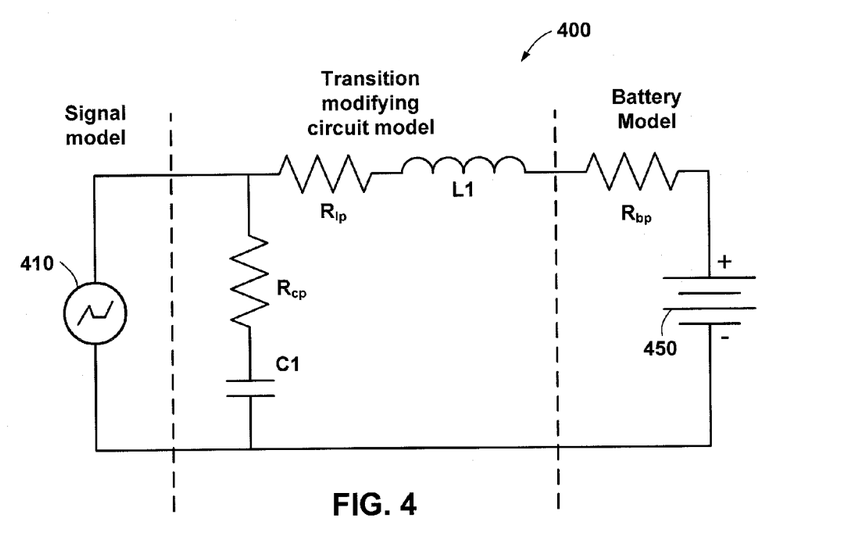
FIG. 4 is a circuit diagram of a model for analyzing the transition modifying circuit with a battery model and a signal model.

FIG. 4 is a circuit diagram 400 of a model for analyzing the transition modifying circuit 300 with a battery model 450 and a signal model 410. The battery model 450 may be configured to include a small parasitic resistor $R_{bp}$, the inductor L1 may be modeled with a small parasitic resistor $R_{1p}$, and the capacitor C1 may be modeled with a small parasitic resistor $R_{cp}$. The signal model 410 may be configured to generate charge pulses and discharge pulses as described below with reference to FIGS. 5 and 6.

Figure 5:
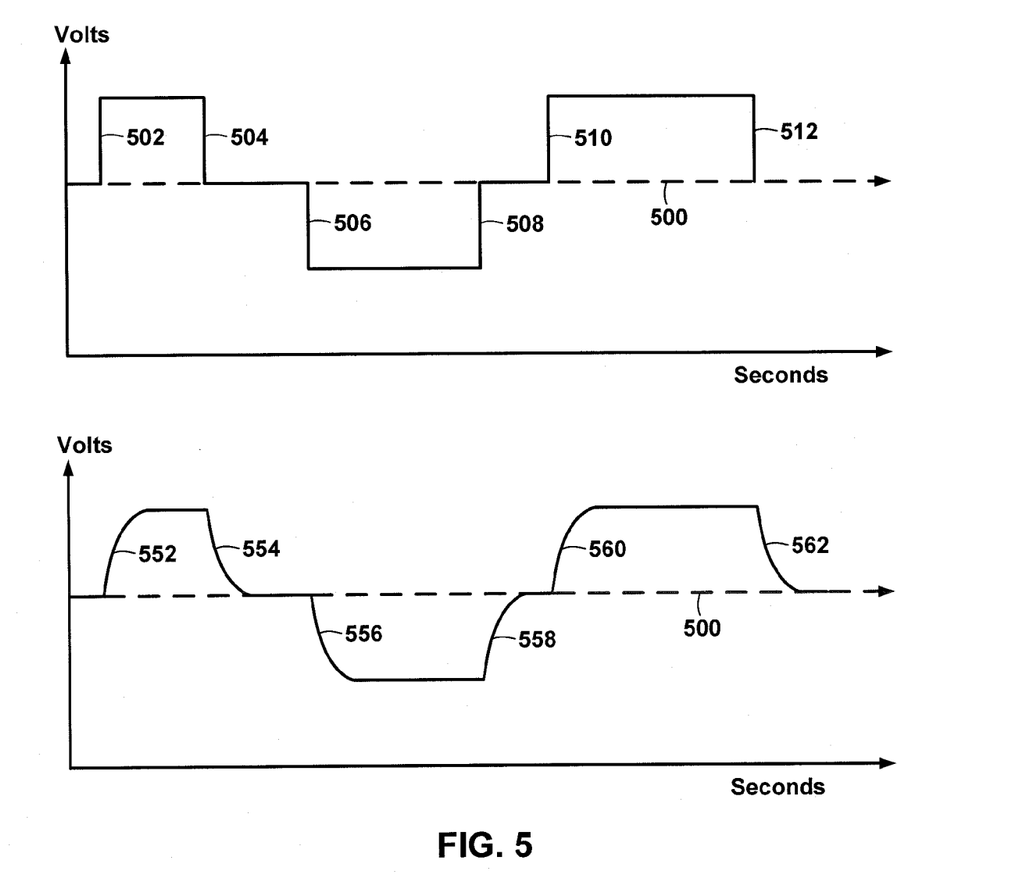
FIG. 5 is a graph of possible charge pulses and discharge pulses that may be applied by the signal model of FIG. 4 and the response at the battery after being conditioned by the transition modifying circuit.

FIG. 5 is a graph of possible charge pulses and discharge pulses that may be applied by the signal model of FIG. 4 and the response at the battery 100 after being conditioned by the transition modifying circuit 300. An upper graph illustrates the charge/discharge input 310 (FIG. 3) with charge pulses and discharge pulses relative to a nominal terminal voltage 500 at the positive terminal of the battery 100. A lower graph illustrates the charge pulses and discharge pulses with an adjusted transition rate (may also be referred to herein as an "applied transition rate") on the pulses as the adjusted signal would be applied to the positive terminal of the battery 100.

Thus, a first charge pulse includes rising edge 502 and falling edge 504, which are modified to generate input transition rates for rising edge 552 and falling edge 554, respectively. Similarly, a discharge pulse includes falling edge 506 and rising edge 508, which are modified to generate input transition rates for falling edge 556 and rising edge 558, respectively. Finally, a second charge pulse includes rising edge 510 and falling edge 512, which are modified to generate As a non-limiting example, in one embodiment, the nominal terminal voltage 500 may be about 3.7 volts and the charge and discharge pulses may be about 0.5 volt above and below the nominal terminal voltage 500.

Figure 6:
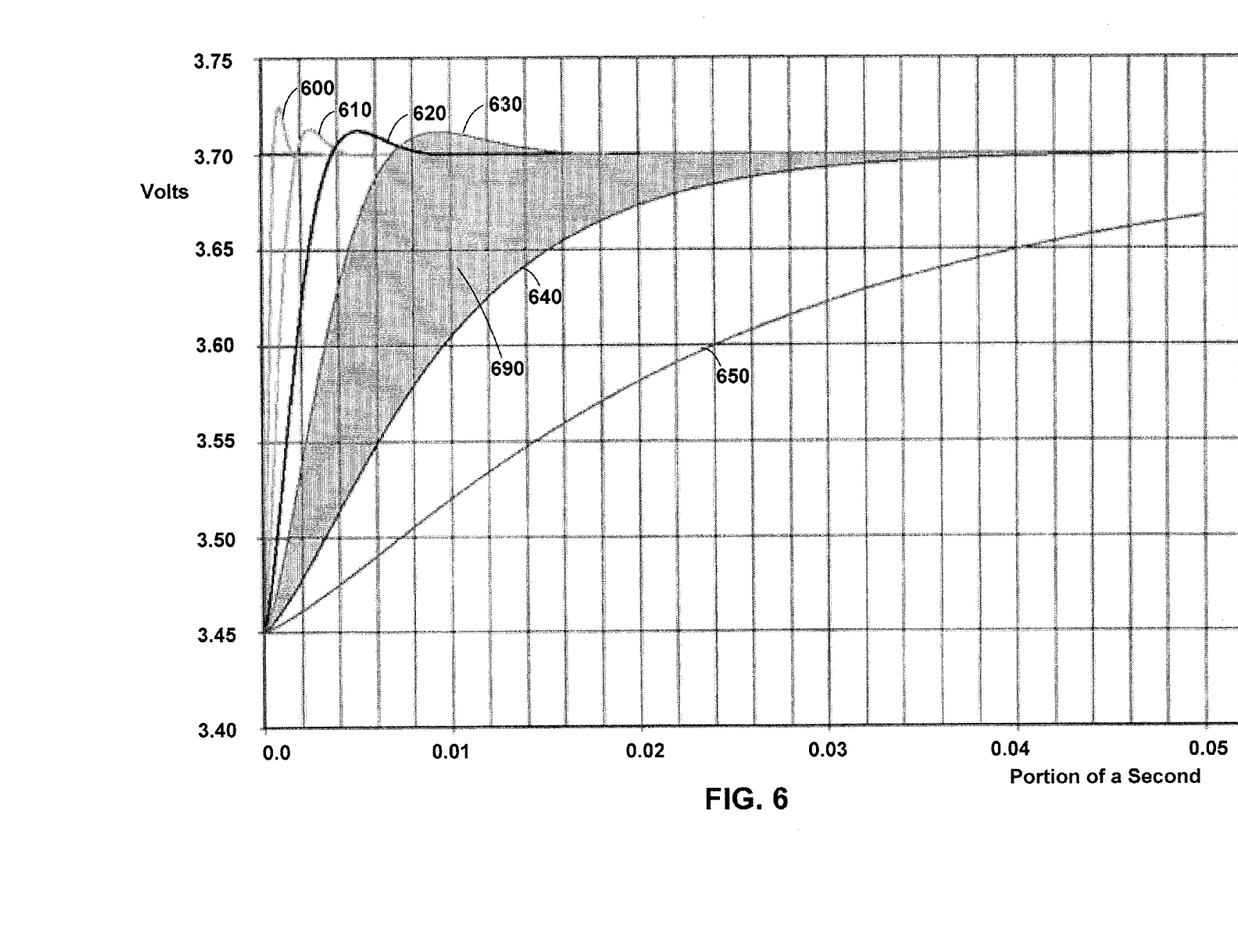
FIG. 6 is a graph of various responses of the transition modifying circuit to an instantaneous rising edge and illustrating a region of interest where further transition rate modification provides minimal additional reduction in battery degradation.

FIG. 6 is a graph of various responses of the transition modifying circuit 300 (FIG. 3) to an instantaneous rising edge and illustrating a region of interest 690 where degradation of the battery 100 is reduced.

As non-limiting examples for the various curves, curve 600 illustrates the applied transition rate to the battery 100 when there is no transition modifying circuit 300. Curve 610 illustrates the applied transition rate to the battery 100 using a 33 uH inductor L1 and a 3.3 mF capacitor C1 for the transition modifying circuit 300. Curve 620 illustrates the applied transition rate to the battery 100 using a 47 uH inductor L1 and a 10 mF capacitor C1 for the transition modifying circuit 300. Curve 630 illustrates the applied transition rate to the battery 100 using a 100 uH inductor L1 and an 18 mF capacitor C1 for the transition modifying circuit 300. Curve 640 illustrates the applied transition rate to the battery 100 using a 200 uH inductor L1 and a 68 mF capacitor C1 for the transition modifying circuit 300. Curve 650 illustrates the applied transition rate to the battery 100 using a 200 uH inductor L1 and a 136 mF capacitor C1 for the transition modifying circuit 300.

As explained below, the region of interest 690 illustrates a region where the applied transition rate creates reduced degradation of charge capacity characteristics for the battery 100, while still using cost effective components and not unduly reducing power that may be delivered to the battery 100. For example, to the left of the region of interest 690 the faster slew rates cause increased degradation to charge capacity characteristics for the battery 100. To the right of the region of interest 690 the slower slew rates require larger, more expensive components and have little effect on battery degradation.

Figure 7:
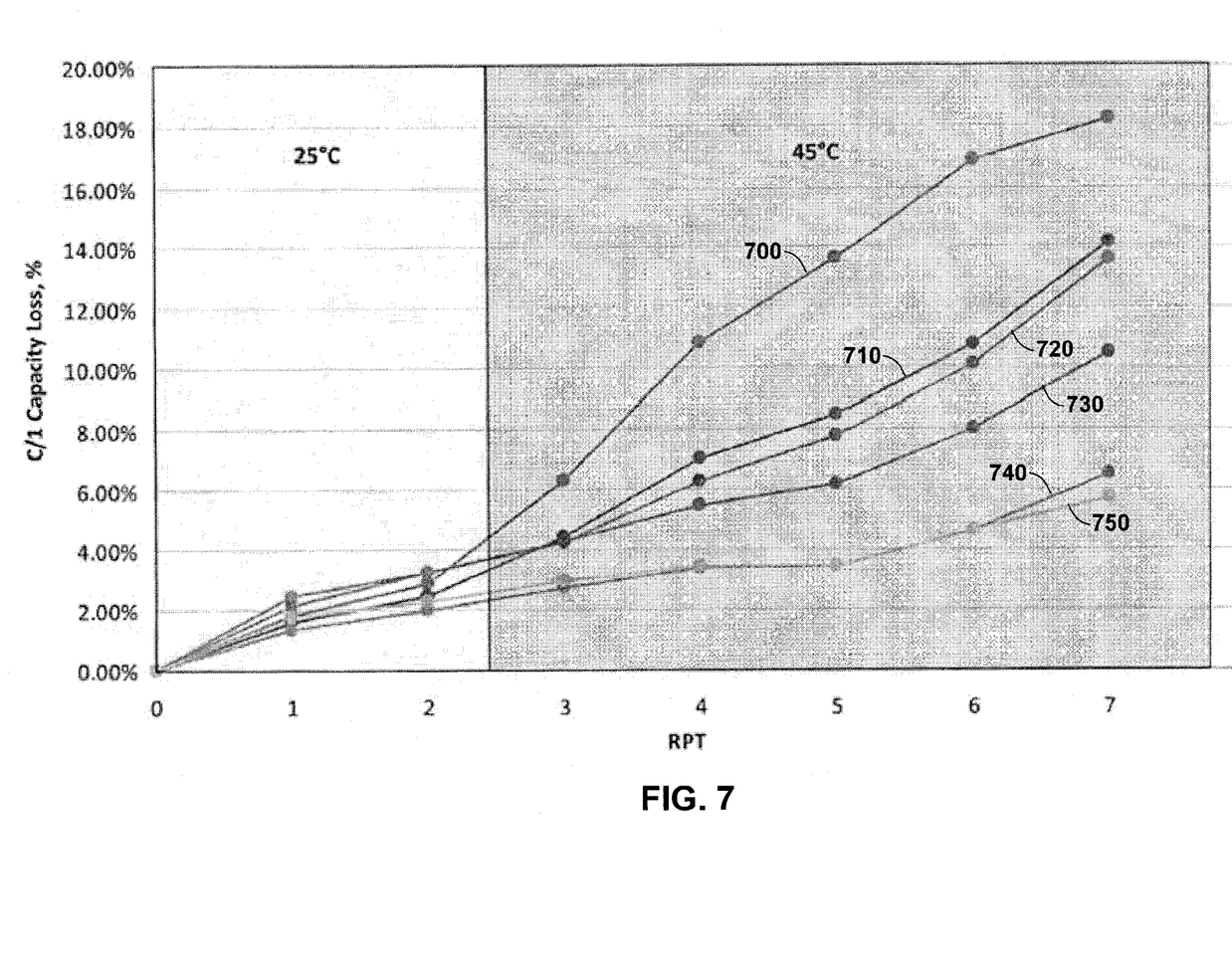
FIG. 7 illustrates graphs of capacity loss over time for various configurations of the transition modifying circuit.

FIG. 7 illustrates graphs of percent capacity loss over time for various configurations of the transition modifying circuit 300 (FIG. 3). The y-axis illustrates percent capacity loss over time. The x-axis illustrates times at which a Reference Performance Test (RPT) was performed.

In the analysis of FIG. 7, each curve represents a corresponding configuration as explained for FIG. 6. In other words, curve 700 is generated with no transition modifying circuit 300 in place, modeling the fastest rise time of the experimental test equipment used as shown in curve 600, curve 710 is generated from the same transition modifying circuit as curve 610, curve 720 is generated from the same transition modifying circuit 300 as curve 620, etc. The curves of FIG. 7 may be referred to herein as indicating a loss trend.

As a non-limiting example, each configuration was stimulated with a repeating sequence of a 10 Amp charge pulse with a duration of about 2.5 seconds followed by a rest duration of about 3 seconds, followed by a 10 Amp discharge pulse with a duration of about 2.5 seconds followed by a rest duration of about 3 seconds. This repeating sequence may be repeated for an analysis period. As a non-limiting example, the analysis period for the graphs of FIG. 7 was about a month.

At the end of each analysis period, a reference performance test was performed for each configuration to determine capacity loss. In measuring the capacity, the battery 100 is first brought to reference temperature (e.g., 25° C.). The capacity loss is graphed as a percentage loss relative to the original capacity of the battery 100.

In the experiments performed for generating the graphs of FIG. 7, the cycling performed during the first two analysis periods was performed at 25° C. In order to accelerate the degradation, the cycling performed during subsequent analysis periods was performed at 45° C.

As can be seen, the baseline curve 700, with no transition modifying circuit, shows a large degradation over time. Each of the other curves (710, 720, 730, 740, and 750) show progressively less degradation over time indicating that the reduced transition rates as shown in FIG. 6 create reduced capacity loss for the electrochemical cells. Moreover, curves 740 and 750 being so close together indicate a diminishing return to reducing capacity loss for large components for the capacitor C1 and the inductor L1.

The region of interest 690 between curves 630 and 640 in FIG. 6 corresponds to capacity losses illustrated between capacity loss curves 730 and 740. Thus, configurations for the transition modifying circuit 300 that generate transition rates in the region of interest 690 create reduced degradation of charge capacity characteristics for the battery 100, while still using cost effective components.

Table 1 shows data that was used to generate FIG. 7.

TABLE 1

Capacity Loss

| | 0 | 1 | 2 | 3 | 4 | % Loss Reduction |
|---|---|---|---|---|---|---|
| Baseline | 0.00% | 1.80% | 2.90% | 6.32% | 10.83% | |
| C1: 33 uH 3.3 mF | 0.00% | 1.58% | 2.49% | 4.43% | 7.00% | 35.41% |
| C2: 47 uH 10 mF | 0.00% | 2.16% | 3.27% | 4.27% | 6.27% | 42.12% |
| C3: 100 uH 18 mF | 0.00% | 2.48% | 3.28% | 4.32% | 5.47% | 49.52% |
| C4: 200 uH 68 mF | 0.00% | 1.34% | 2.03% | 2.77% | 3.43% | 68.34% |
| C5: 200 uH 136 mF | 0.00% | 1.76% | 2.31% | 2.99% | 3.46% | 68.01% |

In Table 1, each column illustrates the results of an RPT performed after the analysis period. Thus, using an analysis period of about a month, each column represents cumulative capacity loss after that month. As mentioned above capacity loss is determined as a percentage of capacity of the battery 100 relative to an initial capacity of the battery 100 prior to testing.

Each of the rows shows a different configuration for the transition modifying circuit 300 and corresponds to the same configurations for circuits discussed above relative to the curves in FIGS. 6 and 7. In other words, the baseline configuration corresponds to curves 600 and 700, configuration C1 corresponds to curves 610 and 710, configuration C2, corresponds to curves 620 and 720, etc.

The last column illustrates a percentage loss reduction relative to the baseline configuration after the fourth RPT. For example, the 3.46% reduction for configuration 5 is 68.01% less than the 10.83% reduction for the baseline configuration.

Table 2 shows raw data that was used to generate Table 1.

TABLE 2

C/1 rate discharge capacities for various batteries

| Test Condition | Formation | RPT 0 | RPT 1 | RPT 2 | RPT 3 | RPT 4 |
|---|---|---|---|---|---|---|
| Baseline | 1.9143605 | 1.88001 | 1.8503 | 1.83348 | 1.77097 | 1.69248 |
| | 1.91482275 | 1.88313 | 1.84672 | 1.82381 | 1.75916 | 1.67377 |
| | 1.91544025 | 1.88413 | 1.84855 | 1.82634 | 1.75998 | 1.66925 |
| C1: 33 uH 3.3 mF | 1.9170015 1.91407225 1.916361 | 1.88811 1.88773 1.88945 | 1.86141 1.85657 | 1.8438 1.83969 | 1.80279 1.80749 | 1.7531 1.76017 |
| C2: 47 uH | 1.91723275 1.9169825 | 1.89091 1.88708 | 1.85592 1.8414 | 1.83346 1.82058 | 1.8064 1.80515 | 1.76101 1.77092 |

TABLE 2-continued

C/1 rate discharge capacities for various batteries

| Test Condition | Formation | RPT 0 | RPT 1 | RPT 2 | RPT 3 | RPT 4 |
|---|---|---|---|---|---|---|
| 10 mF C3: 100 uH | 1.91387225 1.9154775 1.9159855 | 1.8839 1.88756 1.88467 | 1.84211 1.84061 1.84225 | 1.82275 1.8245 1.82583 | 1.80839 1.80519 1.80607 | 1.77496 1.78213 1.78468 |
| 18 mF C4: 200 uH 68 mF | 1.909005 1.90683325 1.9096805 1.90688525 | 1.90014 1.89294 1.89378 1.89124 | 1.84856 1.8493 1.89378 1.85908 | 1.83592 1.85969 1.852752 1.85032 | 1.81623 1.83818 1.8423 1.84003 | 1.79538 1.8263 1.82883 1.82813 |
| C5: 200 uH 136 mF | 1.90961475 1.90924875 1.91663875 | 1.88997 1.89382 1.89991 | 1.85964 1.86028 1.86361 | 1.84982 1.84944 1.8534 | 1.83772 1.83642 1.83988 | 1.83426 1.82519 1.82728 |

In Table 2, each column illustrates the results of an RPT performed after the analysis period. Thus, using an analysis period of about a month, each column represents cumulative discharge capacities in Amp-Hours normalized to a C/1 rate. The first column shows discharge capacity before any cycling occurred.

Each of the groupings of rows show a different configuration for the transition modifying circuit 300 and correspond to the same configurations for circuits discussed above relative to the curves in FIGS. 6 and 7. In other words, the baseline configuration corresponds to curves 600 and 700, configuration C1 corresponds to curves 610 and 710, configuration C2 corresponds to curves 620 and 720, etc. Within each grouping, three similarly configured batteries 100 and transition modifying circuits 300 were constructed and tested. With each configuration shown on a separate row.

To arrive at Table 1 from the raw data of Table 2, each of the measured results were combined and averaged for each of the three groupings. This average was then compared to the original "formation" average to generate the capacity loss values in Table 1.

Figure 8:
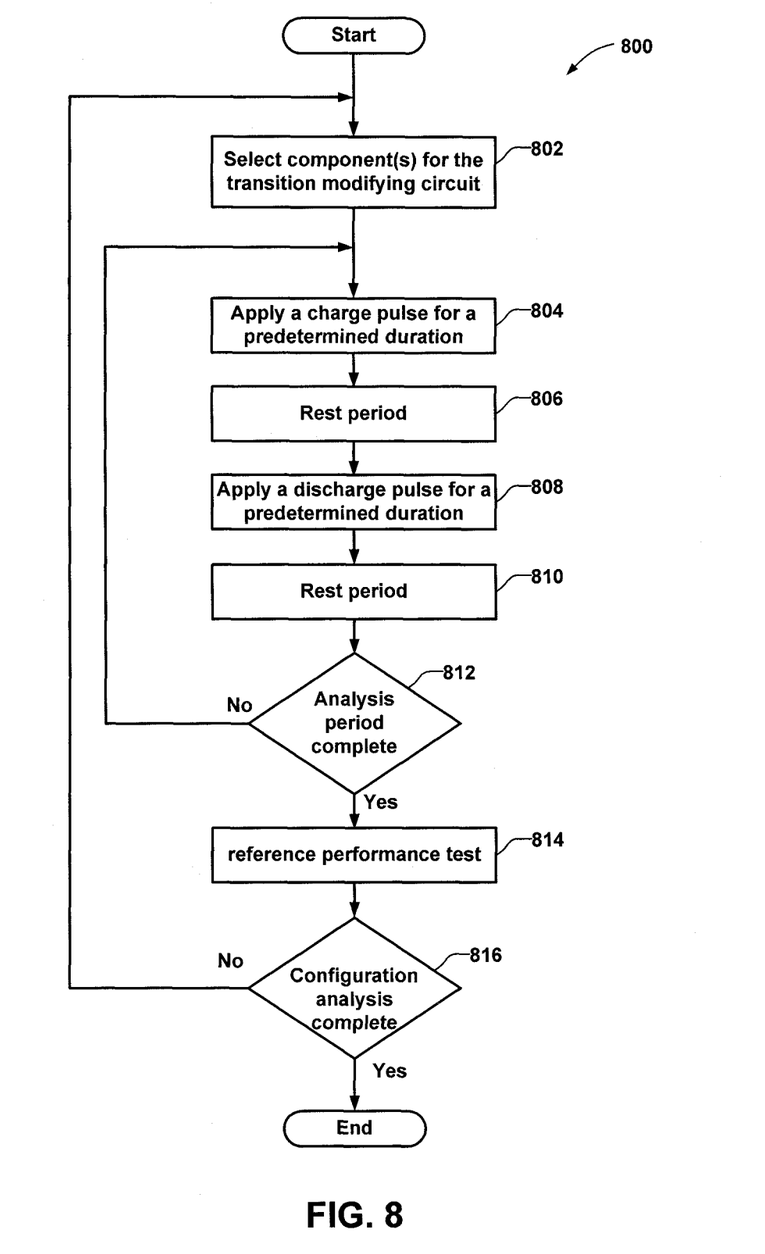
FIG. 8 is a flowchart illustrating operations that may be performed during analysis to determine what type of transition modifying circuit is appropriate for a given battery.

FIG. 8 is a flowchart 800 illustrating operations that may be performed during analysis to determine what type of transition modifying circuit is appropriate for a given battery. Thus, the method illustrated in FIG. 8 shows operations for which the data of FIG. 6, FIG. 7, Table 1, and Table 2 were obtained. In describing the operations of FIG. 8, reference will also be made to FIG. 3. Operation block 802 illustrates that various one or more of a resistance, a capacitance, and an inductance is chosen for the transition modifying circuit 300.

Operation block 804 indicates that a charge pulse of a predetermined duration is applied to the transition modifying circuit 300, and the resulting modified pulse is consequently applied to the battery 100. For the example described herein, a 10 Amp charge pulse is applied for a duration of about 2.5 seconds. Operation block 810 indicates that a rest period may be included after the charge pulse. For the example described herein, a rest period with duration of about 3 seconds is used.

Operation block 808 indicates that a discharge pulse of a predetermined duration is applied to the transition modifying circuit 300, and the resulting modified pulse is consequently applied to the battery 100. For the example described herein, a 10 Amp discharge pulse is applied for a duration of about 2.5 seconds. Operation block 806 indicates that a rest period may be included after the charge pulse. For the example described herein, a rest period with duration of about 3 seconds is used.

Decision block 812 indicates that a test is performed to determine if the analysis period is complete. If not, the process loops back to apply the charge pulse, rest, apply the discharge pulse, and rest is performed again. The analysis loop is repeated until the analysis period is complete. For the example described herein, the analysis period is about a month.

Operation block 814 indicates that at the end of an analysis period, a reference performance test is performed as described above with reference to FIG. 7.

Decision block 816 indicates that a test is performed to determine if the analysis for this configuration of the transition modifying circuit 300 is complete. If so, the process is complete. If not, the process loops back to operation block 802 to select new components for the transition modifying circuit 300, supply a new battery, and the analysis of a new transition modifying circuit 300 begins.

The process described in FIG. 8 illustrates the analysis process for each transition modifying circuit 300 being performed in serial. In other words, each of the graph lines of FIGS. 6 and 7 would be determined one at a time. Given that this could be a very long process with a duration of many months, or even years, the outer loop may be performed in parallel. In other words, one could set up multiple systems with similar batteries 100, but with different transition modifying circuits 300 and run the analysis loops in parallel for each configuration.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed, including legal equivalents. In addition, features from one embodiment may be combined with features of another embodiment while still being encompassed within the scope of the disclosure.

What is claimed is:

1. A circuit, comprising:
one or more electrochemical cells;
a charge/discharge circuit configured to respectively generate charge pulses and discharge pulses to the one or more electrochemical cells, wherein the charge pulses and discharge pulses include a first transition rate; and
a transition modifying circuit operably coupled between the charge/discharge circuit and a terminal of the one or more electrochemical cells, the transition modifying circuit comprising at least one circuit element configured to receive and modify the charge pulses and discharge pulses to exhibit an adjusted transition rate on the terminal that is slower than the first transition rate and sufficient to reduce degradation of one or more charge capacity characteristics of the one or more electrochemical cells, wherein the first transition rate and the adjusted transition rate include rise and fall times for their respective pulses.

2. The circuit of claim 1, wherein the transition modifying circuit comprises at least one of an inductive constituent, a capacitive constituent, and a resistive constituent configured to generate the adjusted transition rate on the terminal.

3. The circuit of claim 1, wherein the transition modifying circuit comprises:
an inductor operably coupled between the charge/discharge circuit and the terminal of the one or more electrochemical cells and for supplying an inductive constituent; and
a capacitor operably coupled between the charge/discharge circuit and a ground terminal of the one or more electrochemical cells and for providing a capacitive constituent.

4. The circuit of claim 3, wherein the capacitor has a capacitance value configured to produce at least one of a transition rate of the charge/discharge circuit, the transition rate on the terminal, a measured characteristic of the one or more electrochemical cells, or a combination thereof.

5. The circuit of claim 3, wherein the inductor has an inductance value configured to produce at least one of a transition rate of the charge/discharge circuit, the transition rate on the terminal, a measured characteristic of the one or more electrochemical cells, or a combination thereof.

6. The circuit of claim 3, further comprising:
monitoring hardware operably coupled to the one or more electrochemical cells and configured to measure one or more characteristics of the one or more electrochemical cells; and
an analysis module operably coupled to the monitoring hardware and the transition modifying circuit;
wherein the capacitor comprises an element in which capacitance can be varied and the analysis module is configured to adjust the capacitance responsive to at least one of a transition rate of the charge/discharge circuit, the transition rate on the terminal, the one or more characteristics of the one or more electrochemical cells, or a combination thereof.

7. The circuit of claim 3, further comprising:
monitoring hardware operably coupled to the one or more electrochemical cells and configured to measure one or more characteristics of the one or more electrochemical cells; and
an analysis module operably coupled to the monitoring hardware and the transition modifying circuit;
wherein the inductor comprises a variable inductor and the analysis module is configured to adjust the inductance of the variable inductor responsive to at least one of a transition rate of the charge/discharge circuit, the transition rate on the terminal, the one or more characteristics of the one or more electrochemical cells, or a combination thereof.

8. A method, comprising:
supplying a charge/discharge input signal for one or more electrochemical cells, the charge/discharge input signal including charge pulses and discharge pulses having a input transition rate; and
modifying the charge/discharge input signal such that the charge pulses and discharge pulses exhibit an applied transition rate sufficient to reduce degradation of one or more charge capacity characteristics of the one or more electrochemical cells relative to degradation at the input transition rate using a transition modifying circuit coupled between a charge/discharge circuit and a terminal of the one or more electrochemical cells, wherein the input transition rate and the applied transition rate include rise and fall times for their respective pulses.

9. The method of claim 8, wherein modifying the charge/discharge input signal to exhibit an applied transition rate using a transition modifying circuit comprises using a transition modifying circuit including at least one of an inductive constituent, a capacitive constituent, and a resistive constituent to generate the applied transition rate on the terminal.

10. The method of claim 8, wherein modifying the charge/discharge input signal to have the applied transition rate comprises:
operably coupling an inductor between the charge/discharge circuit and the terminal of the one or more electrochemical cells to provide an inductive constituent; and operably coupling a capacitor between the charge/discharge circuit and a ground terminal of the one or more electrochemical cells to provide a capacitive constituent.

11. The method of claim 10, wherein operably coupling the capacitor comprises operably coupling a capacitor configured for adjustment of the capacitive constituent responsive to at least one of the input transition rate, the applied transition rate, a measured characteristic of the one or more electrochemical cells, or a combination thereof.

12. The method of claim 10, wherein operably coupling the inductor comprises operably coupling an inductor configured for adjustment of the inductive constituent responsive to at least one of the input transition rate, the applied transition rate, a measured characteristic of the one or more electrochemical cells, or a combination thereof.

13. The method of claim 10, further comprising:
measuring one or more characteristics of the one or more electrochemical cells; and
determining the applied transition rate responsive to an analysis of the one or more characteristics;
wherein operably coupling the capacitor comprises operably coupling a variable capacitor configured for adjustment of the capacitive constituent responsive to the analysis.

14. The method of claim 10, further comprising:
measuring one or more characteristics of the one or more electrochemical cells; and
determining the applied transition rate responsive to an analysis of the one or more characteristics;
wherein operably coupling the inductor comprises operably coupling a variable inductor configured for adjustment of the inductive constituent responsive to the analysis.

15. A method of determining characteristics of a transition modifying circuit, comprising:
analyzing one or more degradation characteristics of an electrochemical cell relative to a first transition rate of a charge/discharge input signal applied to the electrochemical cell from a charge/discharge circuit;
determining, responsive to the analyzing, an adjusted transition rate for a modified signal to be applied to the electrochemical cell for reducing the one or more degradation characteristics; and
selecting at least one of an inductance, a capacitance, and a resistance of the transition modifying circuit for coupling between the electrochemical cell and the charge/discharge circuit for the modified signal to achieve the adjusted transition rate, wherein the first transition rate and the adjusted transition rate include rise and fall times for their respective pulses.

16. The method of claim 15, wherein analyzing the one or more degradation characteristics comprises measuring capacity loss of the electrochemical cell over an analysis period.

17. The method of claim 15, wherein selecting at least one of the inductance, the capacitance, and the resistance comprises:
selecting an inductor for operable coupling between the charge/discharge circuit and a positive terminal of the electrochemical cell; and
selecting a capacitor for operable coupling between the charge/discharge circuit and a negative terminal of the electrochemical cell.

18. A method of determining characteristics of a transition modifying circuit, comprising:
repeatedly applying a charge pulse and a discharge pulse over an analysis period to each of:
a first transition modifying circuit configured to receive the charge pulse and the discharge pulse and generate a first transition rate on a first signal applied to a first electrochemical cell; and
a second transition modifying circuit configured to receive the charge pulse and the discharge pulse and generate a second transition rate on a second signal applied to a second electrochemical cell, wherein the second transition rate is different from the first transition rate, and wherein the first transition rate and the second transition rate include rise and fall times for their respective pulses;
determining capacity loss of each of the first electrochemical cell and the second electrochemical cell after the analysis period;
repeating the repeatedly applying, and the determining the capacity loss, to determine a loss trend for each of the first electrochemical cell and the second electrochemical cell; and
selecting components for the transition modifying circuit responsive to the loss trend of the first electrochemical cell and the loss trend of the second electrochemical cell.

19. The method of claim 18, wherein selecting components for the transition modifying circuit comprises selecting an inductor, a capacitor, a resistor, or an operable combination thereof to achieve a desired transition rate for a signal applied to an electrochemical cell.

20. The method of claim 19, wherein selecting an inductor, a capacitor, a resistor, or an operable combination thereof comprises:
selecting an inductor for operable coupling between the charge/discharge input and a positive terminal of the electrochemical cell; and
selecting a capacitor for operable coupling between the charge/discharge input and a negative terminal of the electrochemical cell.

21. The method of claim 18, wherein the analysis period comprises about a month.

22. The method of claim 18, wherein repeating the repeatedly applying, and the determining the capacity loss to determine a loss trend, comprises repeating at least three times.

* * * * *